(12) United States Patent
Armstrong et al.

(10) Patent No.: US 11,008,647 B2
(45) Date of Patent: May 18, 2021

(54) PVD TITANIUM DIOXIDE FORMATION USING SPUTTER ETCH TO HALT ONSET OF CRYSTALINITY IN THICK FILMS

(71) Applicant: Applied Materials, Inc., Santa Clara, CA (US)

(72) Inventors: Karl Armstrong, Sunnyvale, CA (US); Jinxin Fu, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 30 days.

(21) Appl. No.: 16/258,766

(22) Filed: Jan. 28, 2019

(65) Prior Publication Data

US 2019/0256967 A1 Aug. 22, 2019

Related U.S. Application Data

(60) Provisional application No. 62/632,339, filed on Feb. 19, 2018.

(51) Int. Cl.
```
C23C 14/08    (2006.01)
C23C 14/34    (2006.01)
C23C 14/58    (2006.01)
C23C 14/00    (2006.01)
```

(52) U.S. Cl.
CPC ........ *C23C 14/083* (2013.01); *C23C 14/3485* (2013.01); *C23C 14/584* (2013.01); *C23C 14/5873* (2013.01); *C23C 14/0036* (2013.01)

(58) Field of Classification Search
CPC .............. C23C 14/0036; C23C 14/083; C23C 14/2485; C23C 14/5826; C23C 14/584; C23C 14/5873

USPC ......................................... 204/192.32, 192.3
See application file for complete search history.

(56) References Cited

U.S. PATENT DOCUMENTS

| | | | | |
|---|---|---|---|---|
| 5,279,985 A | * | 1/1994 | Kamiyama | ............. H01L 28/40 |
| | | | | 148/DIG. 14 |
| 6,100,200 A | * | 8/2000 | Van Buskirk | ......... C23C 14/046 |
| | | | | 257/E21.009 |
| 6,646,828 B1 | * | 11/2003 | Sasaki | .................... B82Y 10/00 |
| | | | | 360/123.42 |

(Continued)

FOREIGN PATENT DOCUMENTS

| EP | 0 865 070 A1 | | 9/1998 |
|---|---|---|---|
| JP | 10-247308 | * | 9/1998 |

(Continued)

OTHER PUBLICATIONS

Machine Translation JP 10-247308 (Year: 1998).*

(Continued)

*Primary Examiner* — Rodney G McDonald
(74) *Attorney, Agent, or Firm* — Patterson + Sheridan LLP

(57) ABSTRACT

Embodiments described herein provide methods of forming amorphous or nano-crystalline ceramic films. The methods include depositing a ceramic layer on a substrate using a physical vapor deposition (PVD) process, discontinuing the PVD process when the ceramic layer has a predetermined layer thickness, sputter etching the ceramic layer for a predetermined period of time, and repeating the depositing the ceramic layer using the PVD process, the discontinuing the PVD process, and the sputter etching the ceramic layer until a ceramic film with a predetermined film thickness is formed.

20 Claims, 5 Drawing Sheets

(56) References Cited

U.S. PATENT DOCUMENTS

| | | | |
|---|---|---|---|
| 2004/0188239 A1* | 9/2004 | Robison | H01L 21/76862 |
| | | | 204/192.3 |
| 2005/0211545 A1* | 9/2005 | Cerio, Jr. | H01L 21/76865 |
| | | | 204/192.3 |
| 2008/0268568 A1 | 10/2008 | Liu et al. | |
| 2009/0278224 A1 | 11/2009 | Kim et al. | |
| 2011/0005920 A1 | 1/2011 | Ivanov et al. | |
| 2011/0207283 A1 | 8/2011 | Haukka et al. | |
| 2012/0181167 A1 | 7/2012 | Jiang et al. | |
| 2015/0276993 A1* | 10/2015 | Stolz | C23C 14/08 |
| | | | 428/448 |

FOREIGN PATENT DOCUMENTS

| | | | |
|---|---|---|---|
| JP | 2003-013215 | * | 1/2003 |
| JP | 2007-012560 | * | 1/2007 |
| TW | 200811300 A | | 3/2008 |

OTHER PUBLICATIONS

Machine Translation JP 2003-013215 (Year: 2003).*
Machine Translation JP 2007-012560 (Year: 2007).*
Taiwanese Office Action for Application No. 108105270; dated Oct. 25, 2019; 14 total pages.
PCT Notification of Transmittal of the International Search Report and the Written Opinion of the International Searching Authority for International Application No. PCT/US2019/015416; dated May 13, 2019; 10 total pages.
Taiwan Office Action issued to Application No. 108105270 dated May 6, 2020.

* cited by examiner

PVD TITANIUM DIOXIDE FORMATION USING SPUTTER ETCH TO HALT ONSET OF CRYSTALINITY IN THICK FILMS

CROSS-REFERENCE TO RELATED APPLICATIONS

This application claims priority to U.S. Provisional Patent Application Ser. No. 62/632,339, filed on Feb. 19, 2018, which herein is incorporated by reference.

BACKGROUND

Field

Embodiments of the present disclosure generally relate to forming ceramic films. More particularly, embodiments of the present disclosure relate to methods of forming amorphous or nano-crystalline ceramic films.

Description of the Related Art

Ceramic films, such as titanium dioxide ($TiO_2$), are used in the formation of optical devices such as waveguides, color filters and two dimensional lenses. The functionality of these devices is impacted by the ability to form accurate shapes with very fine detail.

During deposition of thick ceramic films, such as titanium dioxide ($TiO_2$) with a thickness greater than 500 Angstroms (Å), the structure of the films moves from amorphous or nano-crystalline structures to crystalline structures. Large crystalline structures negatively impact the ability to pattern the ceramic films to make smooth structures as the sidewalls of patterned, thick ceramic films have excessive roughness. Current methods include the use of lower substrate temperatures during film growth to discourage the onset of crystalline formation. However, lower substrate temperatures inhibit crystalline formation only briefly and ceramic films of greater than 500 Å would exhibit large crystalline formations.

Accordingly, what is needed in the art are improved methods of forming thick, amorphous or nano-crystalline ceramic films.

SUMMARY

In one embodiment, a method is provided. The method includes depositing a ceramic layer on a substrate using a physical vapor deposition (PVD) process, discontinuing the PVD process when the ceramic layer has a predetermined layer thickness, sputter etching the ceramic layer for a predetermined period of time, and repeating the depositing the ceramic layer using the PVD process, the discontinuing the PVD process, and the sputter etching the ceramic layer until a ceramic film with a predetermined film thickness is formed.

In another embodiment, a method is provided. The method includes introducing a substrate to a physical vapor deposition (PVD) chamber and depositing a ceramic layer on the substrate using a PVD process, discontinuing the PVD process when the ceramic layer has a predetermined layer thickness and removing the substrate from the PVD chamber, introducing the substrate to a sputter etch chamber and sputter etching the ceramic layer for a predetermined period of time, and repeating the depositing the ceramic layer using the PVD process, the discontinuing the PVD process, and the sputter etching the ceramic layer until a ceramic film with a predetermined film thickness is formed.

In yet another embodiment, a method is provided. The method includes introducing a substrate to a physical vapor deposition (PVD) chamber. The PVD chamber has a process volume defined by a chamber body. The process volume includes a target and a pedestal operable to support the substrate. The target is connected to a target switch that when engaged connects the target to a DC power supply operable to provide a pulsed DC power to the target. The pedestal is connected to a pedestal switch that when engaged connects the pedestal to a pulsed radio frequency (RF) power supply operable to provide a RF power to the pedestal. A ceramic layer is deposited on the substrate using a PVD process, the PVD process. The PVD process includes providing a first flow of a sputter gas and a flow of a reactive gas to the process volume and connecting the target to the pulsed DC power supply. The PVD process is discontinued when the ceramic layer has a predetermined layer thickness. In the PVD chamber the ceramic layer is sputter etched for a predetermined period of time. The sputter etching includes providing a second flow of a sputter gas to the process volume and connecting the pedestal to the RF power supply. The depositing the ceramic layer using the PVD process, discontinuing the PVD process, and the sputter etching the ceramic layer is repeated until a ceramic film with a predetermined film thickness is formed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein include methods of forming amorphous or nano-crystalline ceramic films. The method includes depositing a ceramic layer on a substrate using a physical vapor deposition (PVD) process, discontinuing the PVD process when the ceramic layer has a predetermined layer thickness, sputter etching the ceramic layer for a predetermined period of time, and repeating the depositing the ceramic layer using the PVD process, discontinuing the PVD process, and the sputter etching the ceramic layer until a ceramic film with a predetermined film thickness is formed.

Figure 1:
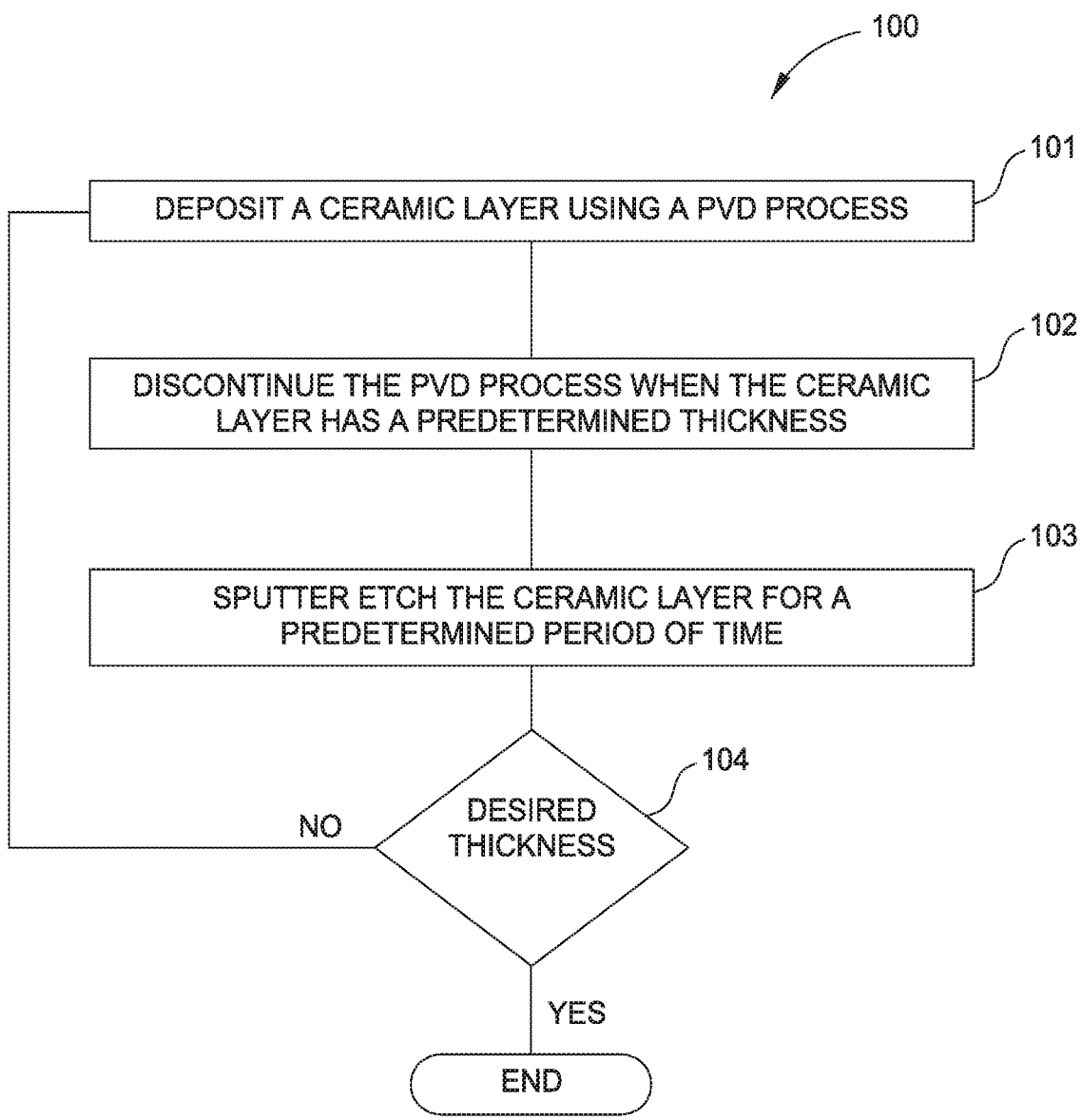
FIG. 1 is a flow diagram illustrating operations of a method for forming an amorphous or nano-crystalline ceramic film according to an embodiment.
Figure 2A:
FIGS. 2A-2C are schematic, cross-sectional views of a substrate during the method for forming an amorphous or nano-crystalline ceramic film according to an embodiment.
Figure 2B:
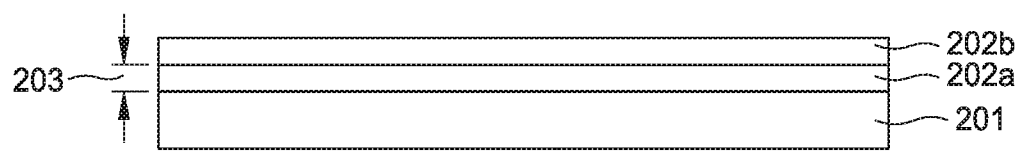
Figure 2C:
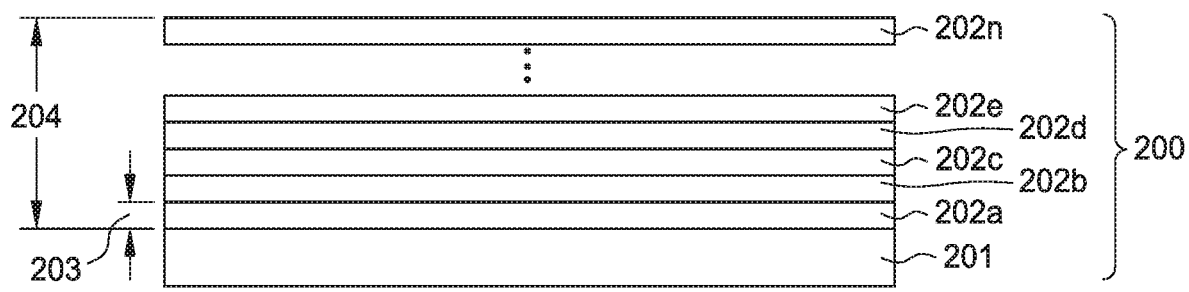

FIG. 1 is a flow diagram illustrating operations of a method 100 for forming an amorphous or nano-crystalline ceramic film 200, as shown in FIGS. 2A-2C. An automated, multi-chambered physical vapor deposition (PVD) system, such as the Endura Sputtering System available from Applied Materials, Inc. located in Santa Clara, Calif., may be utilized to perform the method 100 for forming an amorphous or nano-crystalline ceramic film 200.

Prior to operation 101, a substrate 201 may be introduced to high vacuum conditions in a load lock chamber and transitioned to a chamber for a substrate preparation step to desorb water from the substrate 201. The substrate 201 may be a silicon wafer or a wafer comprising glass, quartz or other materials used in the formation of optical devices. In one embodiment, which can be combined with other embodiments described herein, the wafer preparation step includes degassing in a radiant heat chamber. In another embodiment, which can be combined with other embodiments described herein, the wafer preparation step includes sputter etching in a sputter etch chamber.

At operation 101, a first ceramic layer 202a is deposited on the substrate using a PVD process. In one embodiment, which can be combined with other embodiments described herein, the PVD process is sputter deposition process. The substrate 201 is introduced into a PVD chamber and the first ceramic layer 202a is deposited utilizing a plasma of a sputter gas, such as argon (Ar), and a reactive gas, such as oxygen ($O_2$), to bombard a negatively biased target with argon ions to sputter atoms of the target material, which thereafter coat a substrate with a layer of the target material. The deposited target material reacts with the reactive gas to form the ceramic layer. The first ceramic layer 202a may include titanium dioxide ($TiO_2$), tantalum pentoxide ($Ta_2O_5$), or aluminium (III) oxide ($Al_2O_3$) materials. In one embodiment, which can be combined with other embodiments described herein, the sputter gas includes Ar, the reactive gas includes $O_2$, and the target material includes titanium (Ti) to form a $TiO_2$ layer.

Figure 3A:
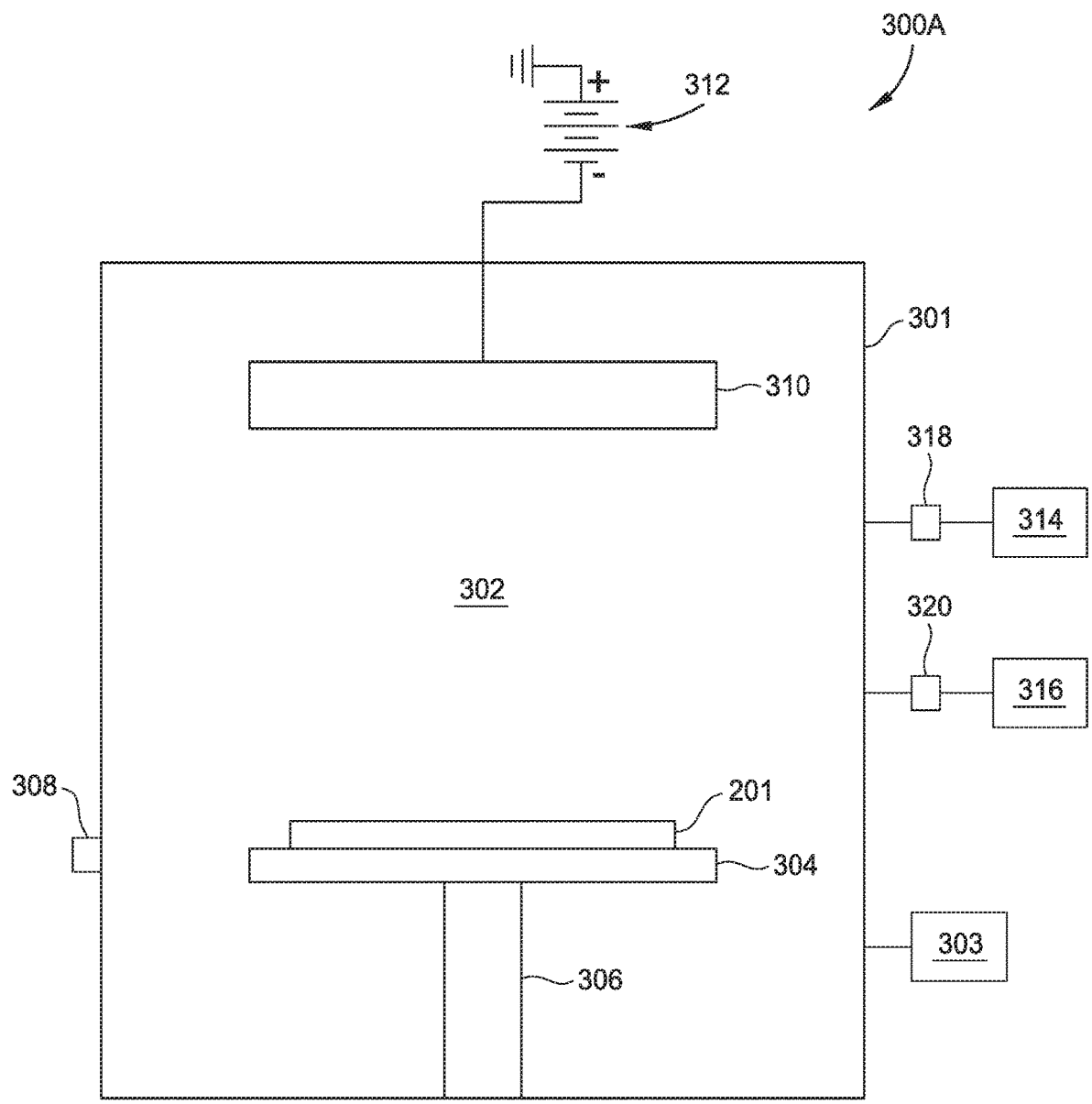
FIG. 3A is a schematic cross-sectional view of a physical vapor deposition (PVD) chamber according to an embodiment.

According to one embodiment, which can be combined with other embodiments described herein, the PVD process is performed in a PVD chamber 300A. It is to be understood that the PVD chamber 300A described herein is an exemplary PVD chamber and other PVD chambers, including PVD chambers from other manufacturers, may be used with or modified to accomplish aspects of the present disclosure. As shown in FIG. 3A, a schematic cross-sectional view of the PVD chamber 300A, the PVD chamber 300A includes a process volume 302 defined by a chamber body 301. The process volume 302 has a target 310 and pedestal 304 operable to support the substrate 201. The pedestal 304 is coupled to and movably disposed in the process volume 302 by a stem 306 connected to a lift system (not shown) that moves the pedestal 304 between an elevated processing position and a lowered position that facilitates transfer of the substrate 201 to and from the PVD chamber 300A through an opening 308 of the chamber body 301.

The target 310 is connected to a power supply 312, such as a DC power supply, a RF power supply, an AC power supply, a pulsed DC power supply, and a pulsed RF power supply. A sputter gas flow controller 318, such as a mass flow control (MFC) device, is disposed between a sputter gas source 314 and the process volume 302 to control a flow of the sputter gas from the sputter gas source 314 to the process volume 302. A reactive gas flow controller 320, such as a MFC device, is disposed between a reactive gas source 316 and the process volume 302 to control a flow of the reactive gas from the reactive gas source 316 to the process volume 302. In one embodiment, which can be combined with other embodiments described herein, a flow rate of Ar is about 20 sccm to about 100 sccm and a flow rate of $O_2$ is about 20 sccm to about 100 sccm. A controller 303 is coupled to the PVD chamber 300A and configured to control aspects of the PVD chamber 300A during processing. At operation 101, the target 310 is negatively biased via the pulsed DC power supply providing a pulsed DC power. It is to be understood that while the discussion of FIG. 1 and FIG. 3A references pulsed DC power, operation 101 is contemplated to be performed with other power supplies as mentioned above with the understanding that appropriate adjustments to accommodate the different power supplies may occur. In one embodiment, which can be combined with other embodiments described herein, the pulsed DC power has a frequency of about 100 kilohertz (kHz), a duty cycle of about 50% to about 90%, such as 70%, and a power level of about 1 kilowatt (kW) to about 10 kW. In another embodiment, which can be combined with other embodiments described herein, the pulsed DC power is provided for about 100 seconds to about 300 seconds.

Figure 3B:
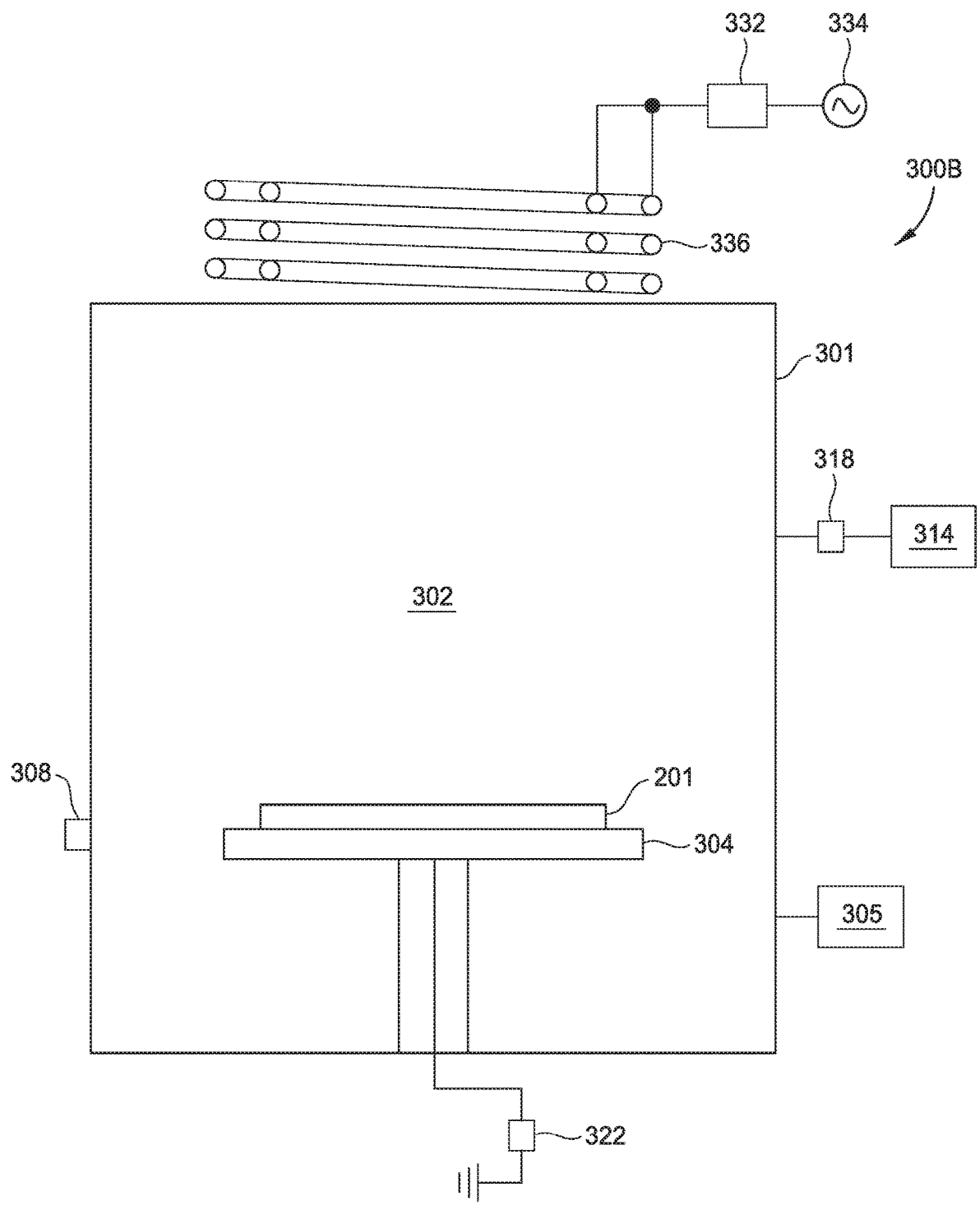
FIG. 3B is a schematic cross-sectional view of a sputter etch chamber according to an embodiment.
Figure 3C:
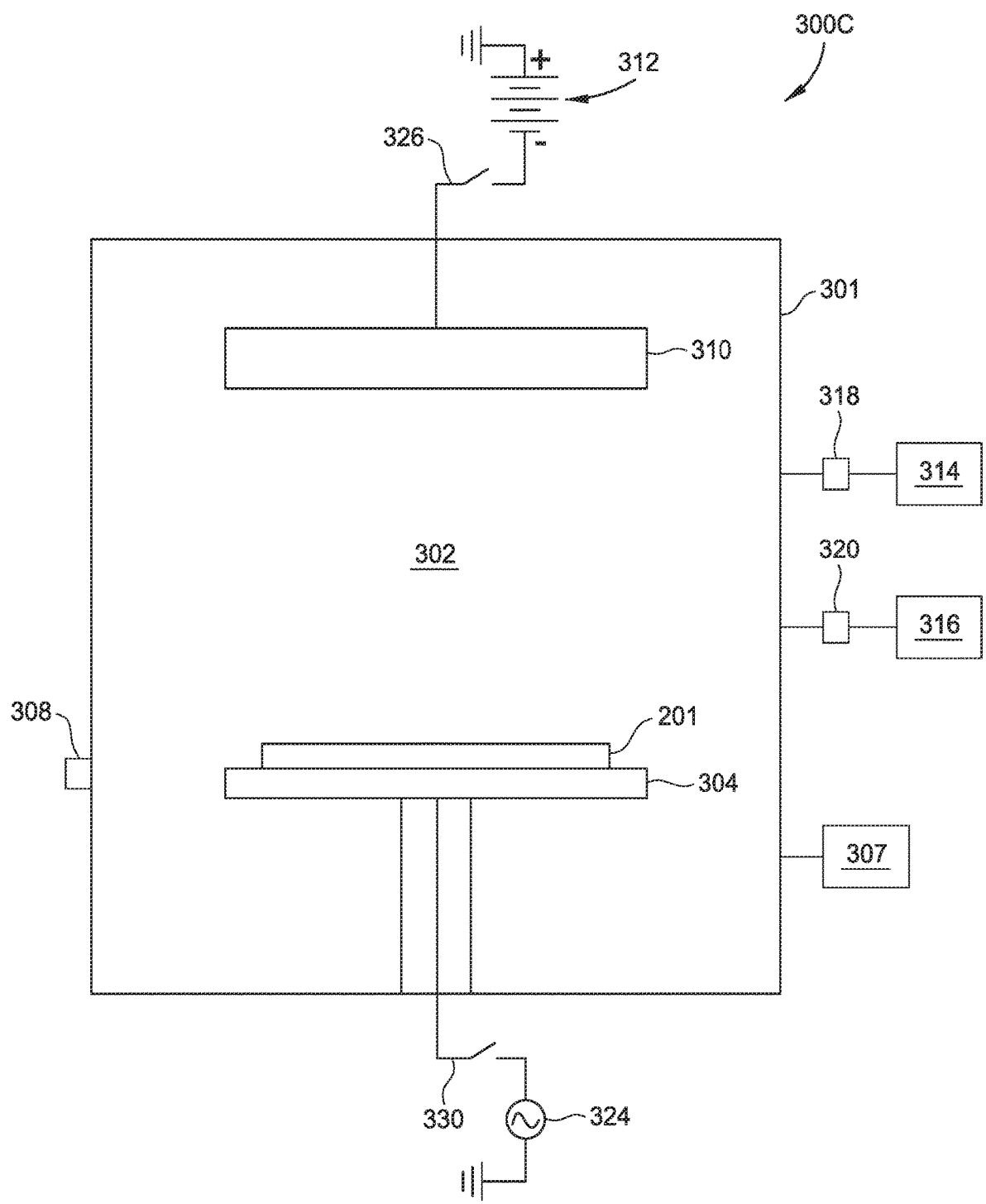
FIG. 3C is a schematic cross-sectional view of a PVD chamber according to an embodiment.

According to another embodiment, which can be combined with other embodiments described herein, the PVD process is performed in a physical vapor deposition (PVD) chamber 300C. It is to be understood that the PVD chamber 300C described herein is an exemplary PVD chamber and other PVD chambers, including PVD chambers from other manufacturers, may be used with or modified to accomplish aspects of the present disclosure. As shown in FIG. 3C, a schematic cross-sectional view of the PVD chamber 300C, the PVD chamber 300C includes the process volume 302 defined by the chamber body 301, the pedestal 304, the stem 306, the opening 308, the sputter gas flow controller 318 disposed between the sputter gas source 314 and the process volume 302, the reactive gas flow controller 320 disposed between the reactive gas source 316 and the process volume 302. In one embodiment, which can be combined with other embodiments described herein, the flow rate of Ar is about 20 sccm to about 100 sccm and the flow rate of $O_2$ is about 20 sccm to about 100 sccm. The target 310 is connected to a target switch 326 that connects the target 310 to the power supply 312, such as a DC power supply, a RF power supply, an AC power supply, a pulsed DC power supply, and a pulsed RF power supply. In FIG. 3C, for example, the target 310 is connected to a pulsed DC power supply. At operation 101, the target 310 is negatively biased via the power supply 312 providing the pulsed DC power. It is to be understood that while the discussion of FIG. 1 and FIG. 3C references pulsed DC power, operation 101 is contemplated to be performed with other power supplies as mentioned above with the understanding that appropriate adjustments to accommodate the different power supplies may occur. In one embodiment, which can be combined with other embodiments described herein, the pulsed DC power has a frequency of about 100 kHz, a duty cycle of about 50% to about 90%, such as 70%, and a power level of about 1 kW to about 10 kW. In another embodiment, which can be combined with other embodiments described herein, the pulsed DC power is provided for about 100 seconds to about 300 seconds.

The pedestal 304 is connected to a pedestal switch 330 that when engaged connects the pedestal 304 to a power supply 324, such as a DC power supply, a RF power supply, an AC power supply, a pulsed DC power supply, and a pulsed RF power supply. At operation 103, further described herein, the pedestal 304 is negatively biased via the power supply 324 providing a RF power. It is to be understood that while the discussion of FIG. 1 and FIG. 3C references RF power, operation 103 is contemplated to be performed with other power supplies as mentioned above with the understanding that appropriate adjustments to accommodate the different power supplies may occur. The PVD chamber 300C operable to independently bias the target 310 and the pedestal 304 allows for operations 101-104 to be performed in the same PVD chamber 300C. A controller 307 is coupled to the PVD chamber 300C and configured to control aspects of the PVD chamber 300C, for example connecting the target switch 326 and connecting the pedestal switch 330, during processing.

At operation 102, the PVD process is discontinued when the first ceramic layer 202a has a predetermined layer thickness 203. The predetermined layer thickness 203 corresponds to a thickness that is less than a point where large crystalline formations occur. In one embodiment, which can be combined with other embodiments described herein, the first ceramic layer 202a is a $TiO_2$ layer and the point where large crystalline formation occurs is about 500 Å. Therefore, the predetermined layer thickness 203 is less than 500 Å, such as about 400 Å. The discontinuing of the PVD process stops growth of the ceramic layer. In one embodiment, which can be combined with other embodiments described herein, when the PVD process is discontinued the substrate 201 is removed from the PVD chamber 300A and introduced to a sputter etch chamber 300B, described in further detail herein. In order to inhibit the onset of large crystalline formations, a sputter etch process is performed independent of the PVD process.

At operation 103, a sputter etch process is performed for a predetermined period of time. In order to inhibit the onset of large crystalline formations, the sputter etch process is performed independent of the PVD process. While the substrate 201 may be biased during the PVD process to form smoother layers, the onset of large crystalline formations would not be inhibited. The sputter etch process utilizes a plasma of a sputter gas, such as Ar, to bombard the substrate 201 that is negatively biased with argon ions to disrupt the first ceramic layer 202a and break up large crystalline nucleation sites formed on the first ceramic layer 202a. However, large crystalline nucleation sites may not be present as the predetermined layer thickness 203 corresponds to a point where large crystalline nucleation sites may not be present. The predetermined period of time corresponds to a period of time necessary to disrupt the first ceramic layer 202a and to the break up the large crystalline nucleation sites that may have been formed on the first ceramic layer 202a. In one embodiment, which can be combined with other embodiments described herein, the sputter etch process is performed for about 5 seconds (sec) to about 25 seconds for a $TiO_2$ layer and only a few angstroms of the ceramic layer are removed.

According to one embodiment, which can be combined with other embodiments described herein, the sputter etch process is performed in a sputter etch chamber 300B. It is to be understood that the sputter etch chamber 300B described herein is an exemplary sputter etch chamber and other sputter etch chambers, including sputter etch chambers from other manufacturers, may be used with or modified to accomplish aspects of the present disclosure. As shown in FIG. 3B, a schematic cross-sectional view of the sputter etch chamber 300B, the sputter etch chamber 300B includes the process volume 302 defined by the chamber body 301, the pedestal 304, the stem 306, and the opening 308. The pedestal 304 is connected to a power supply 322, such as a DC power supply, a RF power supply, an AC power supply, a pulsed DC power supply, and a pulsed RF power supply. In one embodiment, which can be combined with other embodiments described herein, the power supply 322 is a RF power supply and the sputter etch chamber 300B incudes a plurality of coils 336 coupled through a matching circuit 332 to a RF power supply 334. At operation 103, the pedestal 304 is negatively biased via the RF power supply providing a first RF power and a second RF power is provided to the plurality of coils 336. It is to be understood that while the discussion of FIG. 1 and FIG. 3B references RF power, operation 103 is contemplated to be performed with other power supplies as mentioned above with the understanding that appropriate adjustments to accommodate the different power supplies may occur. In one embodiment, which can be combined with other embodiments described herein, the first RF power has a first frequency of about 13.56 megahertz (MHz) and a first power of about 50 watt (W) to about 300 W. The second RF power has a second frequency of about 400 megahertz kHz and a second power of about 50 watt (W) to about 300 W. In another embodiment, which can be combined with other embodiments described herein, the first RF power and the second RF power are provided for about 100 seconds to about 300 seconds. The sputter gas flow controller 318 disposed between a sputter gas source 314 provides a flow of the sputter gas from the sputter gas source 314 to the process volume 302 at operation 103. In one embodiment, which can be combined with other embodiments described herein, a flow rate of Ar is about 20 sccm to about 100 sccm. A controller 305 is coupled to the sputter etch chamber 300B and configured to control aspects of the sputter etch chamber 300B during processing.

At operation 104, the depositing the ceramic layer using the PVD process, discontinuing the PVD process, and the sputter etch process are repeated to form a plurality of ceramic layers 202a, 202b, 202c, 202d, 202e, . . . , 202n until amorphous or nano-crystalline ceramic film 200 with a predetermined film thickness 204, dependent on the type of devices, is formed. In one embodiment, which can be combined with other embodiments described herein, a $TiO_2$ layer is deposited using the PVD process, the PVD process is discontinued at the predetermined layer thickness of about 400 Å, and the sputter etch process is performed for the predetermined period of time of about 15 sec. The depositing the $TiO_2$ layer using the PVD process, discontinuing the PVD process, and the sputter etch process is repeated 5 times until a $TiO_2$ film with thickness of about 2400 Å is formed.

In summation, improved methods of forming thick, amorphous or nano-crystalline ceramic films are described herein. The utilization of performing the sputter etch process independent of the PVD process inhibits the onset of large crystalline formations by disrupting the ceramic layers and breaking up large crystalline nucleation sites formed on the ceramic layers. Repeating depositing ceramic layers using the PVD process, discontinuing the PVD process, and sputter etching allows thick, amorphous or nano-crystalline ceramic films to form without large crystalline formations. Amorphous or nano-crystalline ceramic films without large crystalline formations may be patterned in order to form accurate shapes with smooth sidewalls and may be tailored to have a high refractive index and low absorption rate for use in optical devices such as waveguides, color filters and two dimensional lenses.

While the foregoing is directed to examples of the present disclosure, other and further examples of the disclosure may be devised without departing from the basic scope thereof, and the scope thereof is determined by the claims that follow.

What is claimed is:

1. A method, comprising:
depositing a ceramic layer on a substrate using a physical vapor deposition (PVD) process, the ceramic layer disposed over an entire surface of the substrate;
discontinuing the PVD process when the ceramic layer has a predetermined layer thickness, the predetermined thickness the same over the entire surface of the substrate;
sputter etching the ceramic layer for a predetermined period of time, the sputter etching removing a portion of the ceramic layer with a thickness that is the same over the entire surface of the substrate; and
repeating the depositing the ceramic layer using the PVD process, the discontinuing the PVD process, and the sputter etching the ceramic layer until a ceramic film with a predetermined film thickness is formed that is the same over the entire surface of the substrate.

2. The method of claim 1, wherein the depositing the ceramic layer using the PVD process further comprises introducing the substrate to a PVD chamber.

3. The method of claim 2, wherein the discontinuing the PVD process further comprises removing the substrate from the PVD chamber.

4. The method of claim 3, wherein the sputter etching the ceramic layer further comprises introducing the substrate to a sputter etch chamber.

5. The method of claim 4, further comprising at least one of:
degassing the substrate in a radiant heat chamber; and
sputter etching the substrate in the sputter etch chamber prior to an initial introduction of the substrate to the PVD chamber.

6. The method of claim 1, wherein the ceramic layer and the ceramic film consist essentially of titanium dioxide ($TiO_2$) material.

7. The method of claim 6, wherein the predetermined layer thickness is less than about 500 Angstroms (Å).

8. The method of claim 7, wherein the predetermined layer thickness is about 400 Å.

9. The method of claim 8, wherein the predetermined period of time is about 5 seconds (sec) to about 25 sec.

10. The method of claim 1, wherein the ceramic layer and the ceramic film comprise $TiO_2$, tantalum pentoxide ($Ta_2O_5$), or aluminium(III) oxide ($Al_2O_3$) materials.

11. The method of claim 1, wherein the depositing the ceramic layer using the PVD process, the discontinuing the PVD process, and the sputter etching the ceramic layer until the ceramic film with the predetermined film thickness is formed is performed in the same PVD chamber.

12. A method, comprising:
introducing a substrate to a physical vapor deposition (PVD) chamber and depositing a ceramic layer on the substrate using a PVD process, the ceramic layer disposed over an entire surface of the substrate;
discontinuing the PVD process when the ceramic layer has a predetermined layer thickness and removing the substrate from the PVD chamber, the predetermined thickness the same over the entire surface of the substrate;
introducing the substrate to a sputter etch chamber and sputter etching the ceramic layer for a predetermined period of time, the sputter etching removing a portion of the ceramic layer with a thickness that is the same over the entire surface of the substrate; and
repeating the depositing the ceramic layer using the PVD process, the discontinuing the PVD process, and the sputter etching the ceramic layer until a ceramic film with a predetermined film thickness is formed that is the same over the entire surface of the substrate.

13. The method of claim 12, wherein the ceramic layer and the ceramic film consist essentially of titanium dioxide ($TiO_2$) material.

14. The method of claim 13, wherein the predetermined layer thickness is less than about 500 Angstroms (Å).

15. The method of claim 14, wherein the predetermined period of time is about 5 seconds (sec) to about 25 sec.

16. The method of claim 12, further comprising at least one of:
degassing the substrate in a radiant heat chamber; and
sputter etching the substrate in the sputter etch chamber prior to an initial introduction of the substrate to the PVD chamber.

17. The method of claim 12, wherein the ceramic layer and the ceramic film comprise ($TiO_2$), tantalum pentoxide ($Ta_2O_5$), or aluminium(III) oxide ($Al_2O_3$) materials.

18. A method, comprising:
introducing a substrate to a physical vapor deposition (PVD) chamber, the PVD chamber comprising a process volume defined by a chamber body, the process volume having:
a target, the target connected to a target switch that when engaged connects the target to a DC power supply operable to provide a pulsed DC power to the target; and
a pedestal operable to support the substrate, the pedestal connected to a pedestal switch that when engaged connects the pedestal to a pulsed radio frequency (RF) power supply operable to provide a RF power to the pedestal;
depositing a ceramic layer on the substrate using a PVD process, the ceramic layer disposed over an entire surface of the substrate, the PVD process comprising:
providing a first flow of a sputter gas and a flow of a reactive gas to the process volume; and
connecting the target to the DC power supply;
discontinuing the PVD process when the ceramic layer has a predetermined layer thickness, the predetermined thickness the same over the entire surface of the substrate;
sputter etching the ceramic in the PVD chamber fora predetermined period of time, the sputter etching removing a portion of the ceramic layer with a thickness that is the same over the entire surface of the substrate, the sputter etching comprising:
providing a second flow of a sputter gas to the process volume; and
connecting the pedestal to the RF power supply; and
repeating the depositing the ceramic layer using the PVD process, discontinuing the PVD process, and the sputter etching the ceramic layer until a ceramic film with a predetermined film thickness is formed that is the same over the entire surface of the substrate.

19. The method of claim 18, wherein:
the sputter gas comprises argon (Ar);
the reactive gas comprises oxygen ($O_2$);
a target material of the target comprises titanium (Ti); and
the ceramic layer and the ceramic film consist essentially of $TiO_2$ material.

20. The method of claim 18, wherein the sputter etching removes less than 0.1 Å of the ceramic layer.

\* \* \* \* \*